United States Patent
Lee et al.

(10) Patent No.: US 7,304,882 B2
(45) Date of Patent: Dec. 4, 2007

(54) CIRCUITS FOR DRIVING FRAM

(75) Inventors: Kang-Woon Lee, Seoul (KR);
Byung-Jun Min, Yongin-si (KR);
Han-Joo Lee, Seoul (KR); Byung-Gil Jeon, Suwon-si (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 0 days.

(21) Appl. No.: 11/301,920

(22) Filed: Dec. 13, 2005

(65) Prior Publication Data
US 2006/0126372 A1    Jun. 15, 2006

(30) Foreign Application Priority Data
Dec. 14, 2004    (KR) .............. 10-2004-0105343

(51) Int. Cl.
*G11C 11/22*    (2006.01)
(52) U.S. Cl. ............... 365/145; 365/194; 365/230.08; 365/233.5
(58) Field of Classification Search ............ 365/145, 365/194, 230.08, 233.5
See application file for complete search history.

(56) References Cited

U.S. PATENT DOCUMENTS

| | | | |
|---|---|---|---|
| 6,590,829 B2 | 7/2003 | Takeuchi | |
| 6,889,268 B2 * | 5/2005 | Chae et al. | 710/35 |
| 6,967,890 B2 * | 11/2005 | Shen | 365/226 |

\* cited by examiner

*Primary Examiner*—Hoai V. Ho
(74) *Attorney, Agent, or Firm*—F. Chau & Associates, LLC

(57) ABSTRACT

A drive circuit of a FRAM (Ferroelectric Random Access Memory) includes an address buffer circuit that buffers an applied external address signal and generates an internal address signal, and detects a transition of the internal address signal and generates address transition detection signals for respective internal address signals. The FRAM includes a composite pulse signal generating circuit which limits a subsequent generation of a composite pulse signal for a delay interval provided after a generation of a previous composite pulse signal, in generating the second composite pulse signal obtained by totaling the respective address transition detection signals. The FRAM includes an internal chip enable buffer circuit which generates an internal chip enable signal to generate an internal control signal, in response to the composite pulse signal.

16 Claims, 7 Drawing Sheets

CIRCUITS FOR DRIVING FRAM

CROSS-REFERENCE TO RELATED APPLICATION

This application claims the benefit of Korean Patent Application No. 10-2004-105343, filed 14 Dec. 2004, the disclosure of which is incorporated herein by reference in its entirety.

BACKGROUND OF THE INVENTION

1. Technical Field

The present invention relates to a semiconductor memory device, and more particularly, to a drive circuit of an FRAM for generating a drive signal for performing an operation despite address noise.

2. Discussion of Related Art

Ferroelectric thin films have been developed for as a dielectric film of a capacitor. The ferroelectric thin films improve a refresh operation of DRAM (Dynamic Random Access Memory) devices with large capacities. A ferroelectric random access memory (FRAM, FeRAM) using such a ferroelectric thin film is a nonvolatile memory device having high-speed access, low power consumption and durable construction. FRAM may be implemented in various kinds of electronic equipment having file storage and search functions, such as portable computers, cellular phones, game machines, etc. FRAM may be implemented in other applications, including for example, as a record medium for recording sounds or images.

In FRAM, a memory cell comprises a ferroelectric capacitor and an access transistor. The memory cell stores a logic data state, e.g., '1' or '0', through an electric polarization state of the ferroelectric capacitor. When voltage is applied to both ends of the ferroelectric capacitor, a ferroelectric material of the ferroelectric capacitor is polarized. A polarization state of the ferroelectric material corresponds to a direction of an electric field produced by the voltage. A switching threshold voltage for controlling the polarization state of the ferroelectric material is a coercive voltage. To read data stored in the memory cell, a voltage is applied to generate a potential difference between both electrodes of the ferroelectric capacitor, and the logic data state stored in the memory cell is sensed by a change of charge in a coupled a bit line.

FIG. 1 illustrates a hysteresis curve of the ferroelectric material of the ferroelectric capacitor.

Referring to FIG. 1, when a ground voltage Vss or 0V is applied to the capacitor no electric field is applied to the ferroelectric material and polarization is not generated. When a voltage applied to both ends of the ferroelectric capacitor increases in a positive direction, a polarization level or charge amount increases to a state point A of a positive polarization region from zero. At the state point A, polarization occurs in one direction, and a polarization level at the state point A has a high value. The high polarization level, namely, the charge amount that the ferroelectric material retains, is represented as +Qs. Even though the voltage of both ends of the capacitor falls to ground voltage Vss, a polarization level does not fall to zero but remains at a state point B. The charge amount that ferroelectric material retains is a residual polarization level represented as +Qr. When the voltage of both ends of the capacitor increases in a negative direction, the polarization level is changed to a state point C of a negative charge polarization region from the state point B. At the state point C, the ferroelectric material is polarized in a direction opposite to the polarization direction of the state point A. The polarization level at state point C is represented as −Qs. Even though the voltage of both ends of the capacitor falls to a ground voltage Vss, the polarization level does not fall to zero but remains at a state point D. The residual polarization level at the state point D is represented as −Qr. When the voltage applied to both ends of the capacitor again increases in the positive direction, the polarization level of the ferroelectric material is changed to the state point A from the state point D.

FIG. 2 illustrates a memory cell of a memory cell array in an FRAM.

With reference to FIG. 2, a memory cell is constructed of one access transistor M1 and one ferroelectric capacitor $C_{FE}$. The access transistor M1 has two terminals, a source terminal and a drain terminal, which are respectively connected between one terminal of the ferroelectric capacitor $C_{FE}$ and a bit line B/L. A gate of the access transistor M1 is connected to a word line W/L. A first terminal of the ferroelectric capacitor $C_{FE}$ is coupled to the access transistor M1, and a second terminal thereof is coupled to a plate line P/L.

When a voltage sufficient to generate an electric field is applied to the ferroelectric capacitor, formed of the ferroelectric material disposed between the terminals, a polarization direction set based on a spontaneous polarization is maintained. A surface charge of the ferroelectric material through the spontaneous polarization is not lost naturally by leakage, etc. If a voltage is not applied in an opposite direction so that the polarization level becomes zero, the polarization direction is maintained.

When a voltage is applied in the positive direction to the ferroelectric capacitor and then removed, the residual polarization of the ferroelectric material constituting the ferroelectric capacitor becomes +Qr. When a voltage is applied in the negative direction to the ferroelectric capacitor and then removed, the residual polarization of the ferroelectric material becomes −Qr. When the residual polarization has a state of +Qr, namely, at the state point B, a logic state indicates data '0'. When residual polarization has a state of −Qr, namely, at the state point D, a logic state indicates data '1'. A charge difference in changing from the state point A to the state point B is a voltage corresponding to the amount of non-switching capacitance Qnsw. The non-switching capacitance Qnsw is distinguished from a charge difference in changing from the state point D to the state point A, namely, a voltage corresponding to a switching capacitance Qsw. The switching capacitance Qsw corresponds to a read operation on data stored in memory cell.

An asynchronous FRAM operates according to an external chip control signal, e.g., an external enable signal or external chip selector signal. When the external chip control signal is enabled, an applied external address transition is detected to control a cycle operation by using a composite pulse signal obtained by totaling respective address transition detection signals. An internal clock is generated by the composite pulse signal, and through the composite pulse signal, read and write operations for a corresponding address of memory can be performed. When an external address is changed, a composite pulse signal is generated, and a precedent cycle operation is completed by this signal and a next cycle preparation operation proceeds. Further, an internal chip enable signal (ICE) is generated by the composite pulse signal, and the internal control signals needed for operation of a memory device are generated by the internal chip enable signal. Thus, a time for generation of the composite pulse signal is important to an operation of the memory device.

FIG. 3 illustrates timings for a read operation in an FRAM.

As shown in FIG. 3, a read operation in an FRAM starts by a transition and enabling of an external chip control signal XCEB from a logic 'high' level to a logic 'low' level.

An external address signal XA is applied by the enabling of the external chip control signal XCEB. The external address XA is applied to an address buffer circuit (not shown). The address buffer circuit buffers the applied external address signal XA and generates an internal address signal. Further, the address buffer circuit detects a transition of the internal address signal and generates address transition detection signals for respective address signals. The address transition detection signals are totaled in a composite pulse signal generating circuit, and become a composite pulse signal ATD_SUM as an address transition detection signal. The composite pulse signal ATD_SUM is a short pulse signal that is enabled for a given time and then disabled.

An internal chip enable signal ICE is generated by the composite pulse signal ATD_SUM, and the internal control signals needed for operation of a memory device are generated by the internal chip enable signal ICE. The internal chip enable signal is not generated in a transition for enabling the composite pulse signal ATD_SUM, but is generated in a transition for disabling the composite pulse signal ATD_SUM after the address transition detection signals are applied.

When the internal chip enable signal ICE is generated, a word line W/L is enabled by a word line decoder and driver circuit (not shown). A plate line P/L is enabled by a plate control signal generated in response to the internal chip enable signal ICE.

When the plate line P/L is enabled, operation at a charge sharing interval t1 starts. A voltage corresponding to data stored in a memory cell is developed to a bit line B/L, that maintains a ground level state at the charge sharing interval t1.

A sense amplifier enable signal SAEN, responding to an enabling of the plate control signal, is generated, enabling a sense amplifier. When the sense amplifier is enabled, operation at the charge sharing interval t1 is finished, and operation of a sensing interval t2 starts. At the sensing interval t2, data developed to the bit lint B/L is sensed and amplified by the sense amplifier.

The operation at the sensing interval t2 is finished by a disabling of the plate line P/L through the plate control signal, and operation of a write-back interval t3 starts.

At the write-back interval t3, previous data is restored; data stored in a memory cell is reversed when a plate line is enabled for a general read operation and needs to be restored. The write-back interval t3 needs to be sufficient to prevent a breakage of data stored in a memory cell.

The operation of the write-back interval t3 continues until the sense amplifier is disabled by a subsequently generated composite pulse signal ATD_SUM after disabling the plate line P/L.

When the sense amplifier is disabled, the internal chip enable signal and the word line W/L are disabled, and the read operation is completed. In a transition for disabling the subsequently generated composite pulse signal ATD_SUM, an internal chip enable signal is again generated, and the next operation is performed.

FIG. 4 illustrates timings for an abnormal operation, e.g., a read operation including address noise, in an FRAM.

As shown in FIG. 4, in a read operation is performed until the sensing interval t2, similar to FIG. 3. To perform a restoring operation when the sensing interval t2 is finished and an operation of the write-back interval t3 starts, sufficient time is needed. In a case where noise occurs in an address signal, the composite pulse signal ATD_SUM to be subsequently generated is generated early and a time to perform the restoring operation is shortened. The read operation is finished under such a state that sufficient time to perform restoring operation is not provided. Thus, breakage of data stored in memory cells may be caused.

Therefore, a need exists for a drive circuit of an FRAM for generating a drive signal for performing an operation despite address noise.

SUMMARY OF THE INVENTION

According to an exemplary embodiment of the present invention, a drive circuit of an FRAM comprises an address buffer circuit for buffering an applied external address signal and generating an internal address signal, and detecting a transition of the internal address signal and generating a plurality of address transition detection signals for respective internal address signals. The FRAM comprises a composite pulse signal generating circuit for limiting a subsequent generation of a second composite pulse signal to a delay interval provided after a generation of a first composite pulse signal, in generating the second composite pulse signal obtained by totaling the plurality of address transition detection signals. The FRAM comprises an internal chip enable buffer circuit for generating an internal chip enable signal to generate an internal control signal, in response to the composite pulse signal.

The internal chip enable signal may be generated in response to a transition for disabling the composite pulse signal. The drive circuit of the FRAM may further comprise a plate control signal generating circuit for generating a plate control signal for an enabling and disabling of plate line in response to the internal chip enable signal. The delay interval may be a time interval obtained by totaling a first delay interval as an enable section of the plate control signal and a second delay interval having determine time after a disabling of the plate control signal. The first delay interval may be a time interval enough to sense data of a memory cell in a read operation of the FRAM, and the second delay interval may be a time interval enough to perform a restoring of previous data.

The composite pulse signal generating circuit may include a composite pulse signal generating part for totaling and outputting a sum of the plurality of respectively inputted address transition detection signals, and a delay part for outputting an output signal of the composite pulse signal generating part as the second composite pulse signal, before the plate control signal is enabled when the internal chip enable signal is not applied, and for outputting an output signal to restrict an effect of the output signal of the composite pulse signal generating part outputted as the second composite pulse signal, at a time interval obtained by totaling the first and second delay intervals, after an enabling of the plate control signal. The composite pulse signal generating circuit may include an output part for generating the composite pulse signals in response to an output signal of the composite pulse signal generating part and an output signal of the delay part.

The composite pulse signal generating part may include a first NAND circuit for performing an NAND operation on respectively inputted address transition detection signals. The delay part may include a first inverter for inverting the plate control signal, a second inverter for inverting an output signal of the first inverter, and a delay unit for delaying for a time an output of the second inverter. The delay part may further include a third inverter for inverting an output signal of the delay unit, a second NAND circuit for performing a NAND operation on an output signal of the first inverter and an output signal of the third inverter, and a fourth inverter for inverting an output of the second NAND circuit and applying it as an input signal of the output part. The delay part may further include a PMOS transistor that is driven by the output signal of the first inverter and that controls an input signal level of the third inverter as a power source voltage level. The output part may include a third NAND circuit for performing a NAND operation on an output signal of the composite pulse signal generating part and an output signal of the delay part; and a fifth inverter for inverting and outputting an output signal of the third NAND circuit, and generating the second composite pulse signal.

The systematic configuration according to an exemplary embodiment of the invention, a stabilized read operation can be provided and a breakage of data stored in memory cells can be prevented or substantially reduced.

According to an exemplary embodiment of the present invention, a composite pulse signal generating circuit of a drive circuit of a FRAM (Ferroelectric Random Access Memory) limits a subsequent generation of a second composite pulse signal for a delay interval provided after a generation of a first composite pulse signal. The composite pulse signal generating circuit includes a composite pulse signal generating part for totaling and outputting a sum of a plurality of address transition detection signals. The composite pulse signal generating circuit includes a delay part for outputting an output signal of the composite pulse signal generating part as the second composite pulse signal, before a plate control signal is enabled when an internal chip enable signal is not applied, and for outputting an output signal to restrict an effect of the second composite pulse signal in a time interval, after an enabling of the plate control signal. The composite pulse signal generating circuit further includes an output part for generating the composite pulse signals in response to an output signal of the composite pulse signal generating part and an output signal of a delay part, wherein the output signal is the time interval.

BRIEF DESCRIPTION OF THE DRAWINGS

Exemplary embodiments of the present invention will become readily apparent from the description that follows, with reference to the attached drawings in which.

DETAILED DESCRIPTION OF PREFERRED EMBODIMENTS

Exemplary embodiments of the present invention are more fully described below with reference to FIGS. 5 to 7. The present invention may, however, be embodied in many different forms and should not be construed as being limited to exemplary embodiments set forth herein; rather, exemplary embodiments are provided so that this disclosure is thorough and complete, and conveys the concept of the invention to those skilled in the art.

Figure 5:
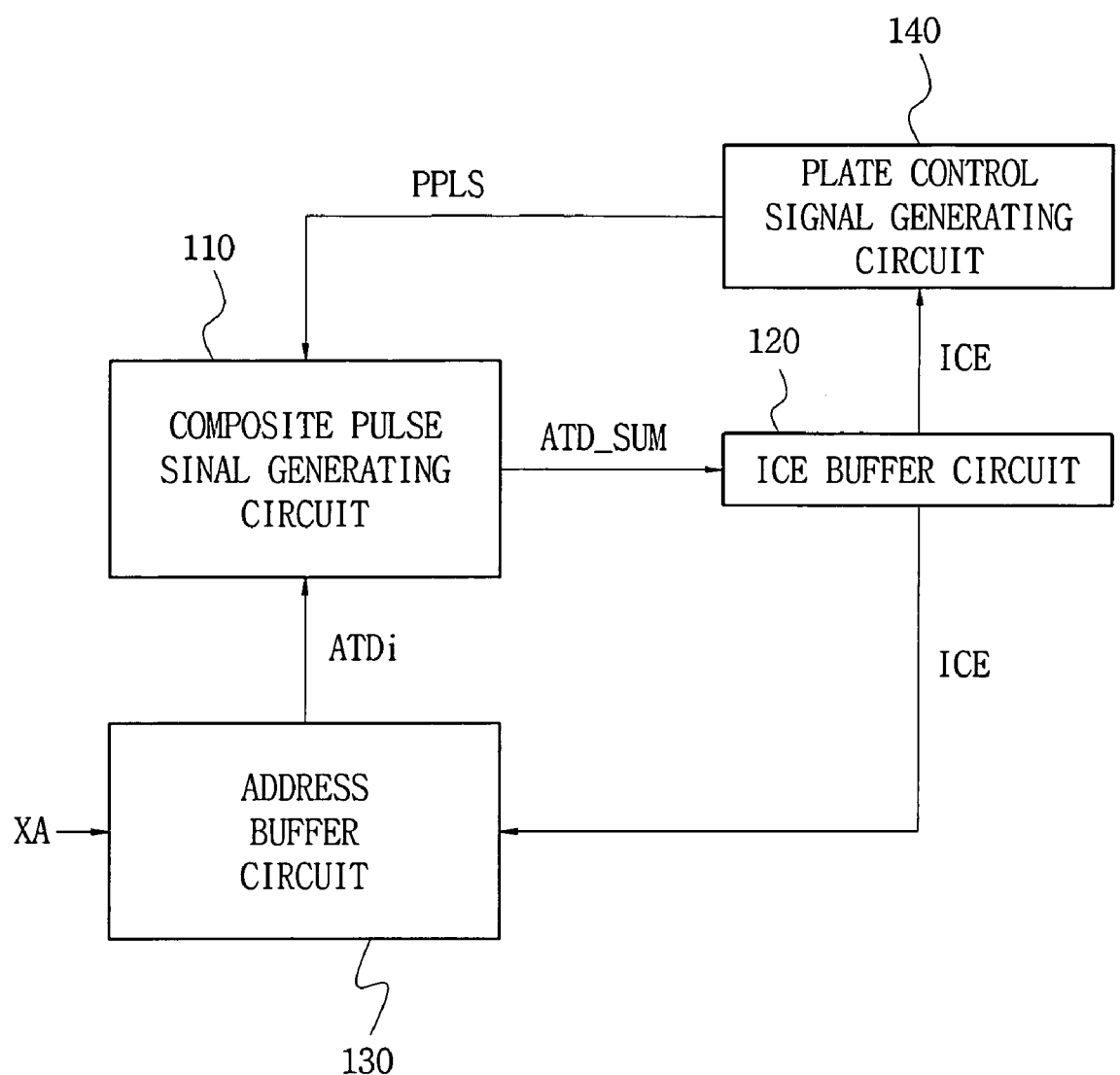
FIG. 5 is a block diagram for a drive circuit of an FRAM according to an exemplary embodiment of the present invention.

FIG. 5 is a block diagram for a drive circuit of an FRAM according to an exemplary embodiment of the present invention.

Referring to FIG. 5, a drive circuit of the FRAM according to an exemplary embodiment includes a composite pulse signal generating circuit 110, an internal chip enable (ICE) buffer circuit 120, an address buffer circuit 130 and a plate control signal generating circuit 140.

The composite pulse signal generating circuit 110 adds up respective address transition detection signals ATDi applied from the address buffer circuit 130, and generates a composite pulse signal ATD_SUM. The composite pulse signal generating circuit 110 is configured to limit a generation of a next composite pulse signal to a given delay interval after the generation of a prior composite pulse signal ATD_SUM.

The given delay interval is a time interval sufficient to sense data of a memory cell and restore previous data by the first composite pulse signal ATD_SUM, in read operation of a semiconductor memory device.

The composite pulse signal generating circuit 110 determines the delay interval by using a plate control signal inputted from the plate control signal generating circuit 140. The delay interval is a time interval obtained by totaling a first delay interval as an enable section of the plate control signal and a second delay interval having a time after a disabling of the plate control signal.

Figure 6:
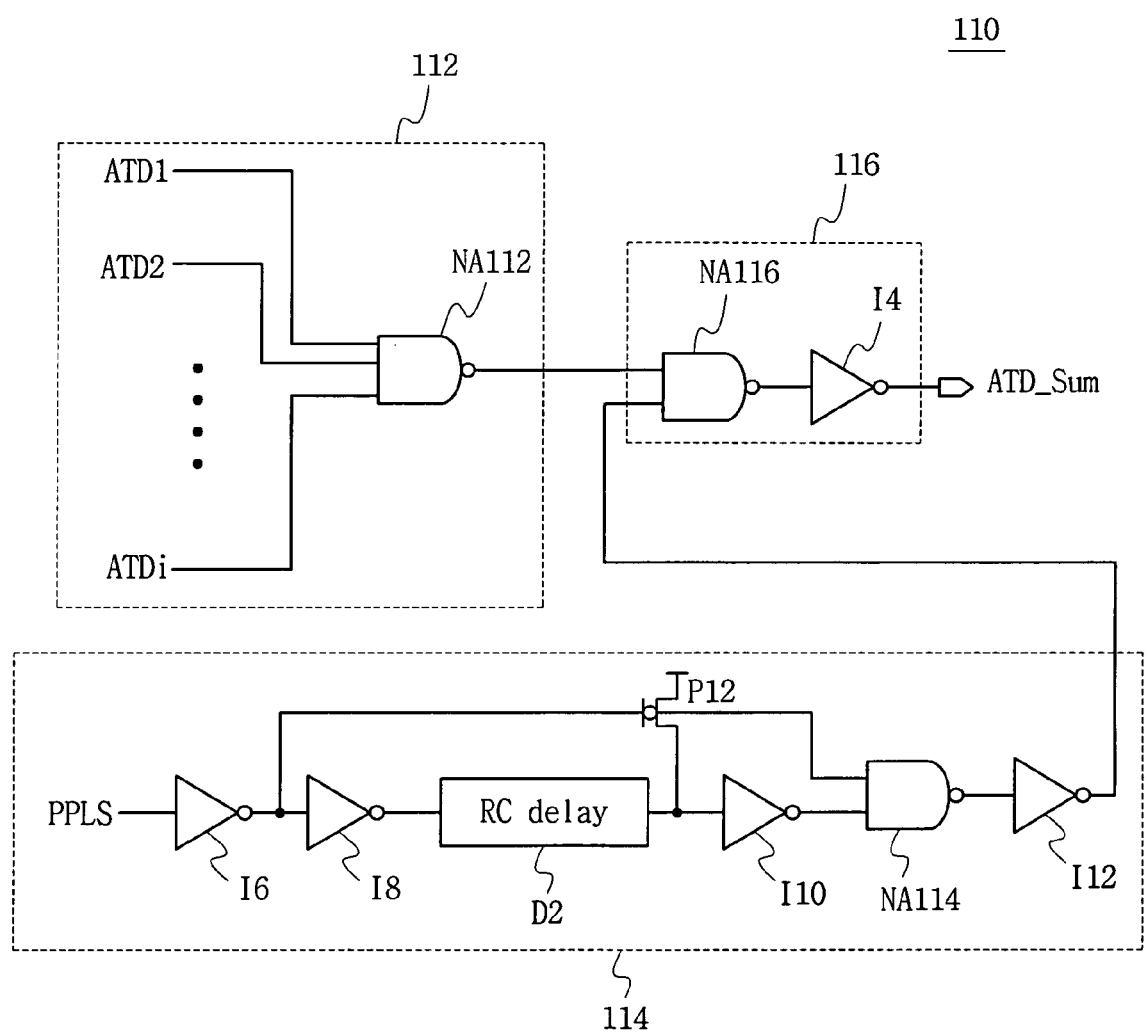
FIG. 6 depicts a block diagram and circuit diagram of a composite pulse signal generating circuit shown in FIG. 5.

An exemplary embodiment of the composite pulse signal generating circuit 110 is shown in FIG. 6.

The address buffer circuit 130 buffers an applied external address signal and generates an internal address signal. The address buffer circuit 130 detects a transition of the internal address signal and generates address transition detection signals ATDi for respective address signals.

The internal chip enable buffer circuit 120 generates an internal chip enable signal ICE to generate an internal control signal needed for operation of the memory device in response to the composite pulse signal ATD_SUM. Internal control signals needed for operation of the memory device are generated by the internal chip enable signal ICE. The internal control signals include, for example, a word line control signal for enabling and disabling of word line, a plate line control signal for enabling and disabling the plate line, etc.

The plate control signal generating circuit 140 generates a plate control signal PPLS for enabling and disabling the plate line in response to the internal chip enable signal ICE.

FIG. 6 depicts a block diagram and circuit diagram of the composite pulse signal generating circuit 110 shown in FIG. 5.

As shown in FIG. 6, the composite pulse signal generating circuit 110 includes a composite pulse signal generating part 112, a delay part 114 and an output part 116.

The composite pulse signal generating part 112 adds up and outputs a sum of respectively inputted address transition detection signals ATD1, ATD2 and ATDi.

The composite pulse signal generating part 112 may include a first NAND circuit NA112 for performing a NAND operation on respectively inputted address transition detection signals ATD1, ATD2 and ATDi. The first NAND circuit NA112 maintains a logic 'high' level in a stand-by state of the respective address transition detection signals ATD1, ATD2 and ATDi. The first NAND circuit NA112 adopts a short pulse of a logic 'low' level in an address transition. When the respective address transition detection signals ATD1, ATD2 and ATDi have an opposite logic state, e.g., a logic 'low' level in the state-by state, the composite pulse signal generating part 112 may be re-configured with a NOR circuit or other circuits.

The delay part 114 does not prevent the output part 116 from outputting the composite pulse signal ATD_SUM before the plate control signal PPLS is enabled. So, the output part 116 receives an output signal of the composite pulse signal generating part 112 and outputs the composite pulse signal ATD_SUM.

After the plate control signal PPLS is enabled when the internal chip enable signal ICE is applied, the delay part 114 outputs an output signal to the output part 116 to prevent the output part 116 from outputting the output signal of the composite pulse signal generating part 112 as the composite pulse signal ATD_SUM, at a time interval obtained by totaling the first and second delay intervals.

The delay part 114 may include a first inverter I6 for inverting the applied plate control signal PPLS; a second inverter I8 for inverting an output signal of the first inverter I6; a delay unit D2 for delaying for determine time an output of the second inverter I8; a third inverter I10 for inverting an output signal of the delay unit D2; a second NAND circuit NA114 performing a NAND operation on the output signal of the first inverter I6 and an output signal of the third inverter I10; and a fourth inverter I12 for inverting an output of the second NAND circuit NA114 and applying it as an input signal of the output part 116. The delay unit D2 is designed to have a delay to achieve a time interval obtained by totaling the first and second delay intervals. For example, the delay time interval of the delay unit D2 may be substantially equal to the second delay interval.

The delay part 114 may further include a PMOS transistor P12 that is driven by the output signal of the first inverter I6 and that controls an input signal level of the third inverter I10 as a level of power source voltage VDD. The PMOS transistor P12 limits an output change of the delay part 114 based on an output of the delay unit D2 when the plate control signal PPLS is applied.

The output part 116 generates the composite pulse signal ATD_SUM in response to an output signal of the composite pulse signal generating part 112 and an output signal of the delay part 114.

The output part 116 may include a third NAND circuit NA116 performing a NAND operation on the output signal of the composite pulse signal generating part 112 and the output signal of the delay part 114; and a fifth inverter I4 for inverting an output signal of the third NAND circuit NA116, and generating the composite pulse signal ATM_SUM.

The composite pulse signal generating circuit 110 may be realized by those skilled in the art of the invention through various methods other than exemplary embodiments described with reference to FIG. 6.

Operation of the composite pulse signal generating circuit 110 shown in FIG. 6 will be described as follows.

In a stand-by state, the address transition does not occur. Thus, the address transition detection signals ATD1, ATD2 and ATDi maintain a logic 'high' level, and the plate control signal PPLS maintains a logic 'low' level as a disabling state. An output of the composite pulse signal generating part 112 is maintained as a logic 'low' level, an output signal of the delay part 114 is maintained as a logic 'high' level, and in the output part 116, a logic 'low' level is maintained.

When an address is applied from the outside and an address transition occurs, the address transition detection signals ATD1, ATD2 and ATDi are transited from a logic 'high' level to a logic 'low' level. The composite pulse signal generating part 112 outputs a pulse signal of a logic 'high' level. As the plate control signal PPLS has a non-enabling state, an output signal of the delay part 114 maintains a logic 'high' level and the output part 116 generates and outputs a composite pulse signal ATD_SUM enabled to a logic 'high' level.

The plate control signal PPLS is enabled to a logic 'high' level by the generation of the composite pulse signal ATD_SUM. The output signal of the delay part 114 is transited from a logic 'high' level to a logic 'low' level by the enabling of the plate control signal PPLS. This logic 'low' state continues until the plate control signal PPLS is disabled and a determined time elapses. The determined time is a time interval obtained by totaling the first delay interval and the second delay interval. During the time interval, if an address transition occurs due to noise, etc., such that the composite pulse signal generating part 112 outputs a pulse signal of logic 'high' level, the composite pulse signal ATD_SUM is not generated from the output part 116.

After a lapse of the time interval of the first and second delay intervals, an output signal of the delay part 114 is determined as a logic 'high' level, and a pulse signal of logic 'high' level is outputted from the composite pulse signal generating part 112. Thus, the pulse signal is outputted by the output part 116 and a next composite pulse signal ATD_SUM is outputted.

Figure 7:
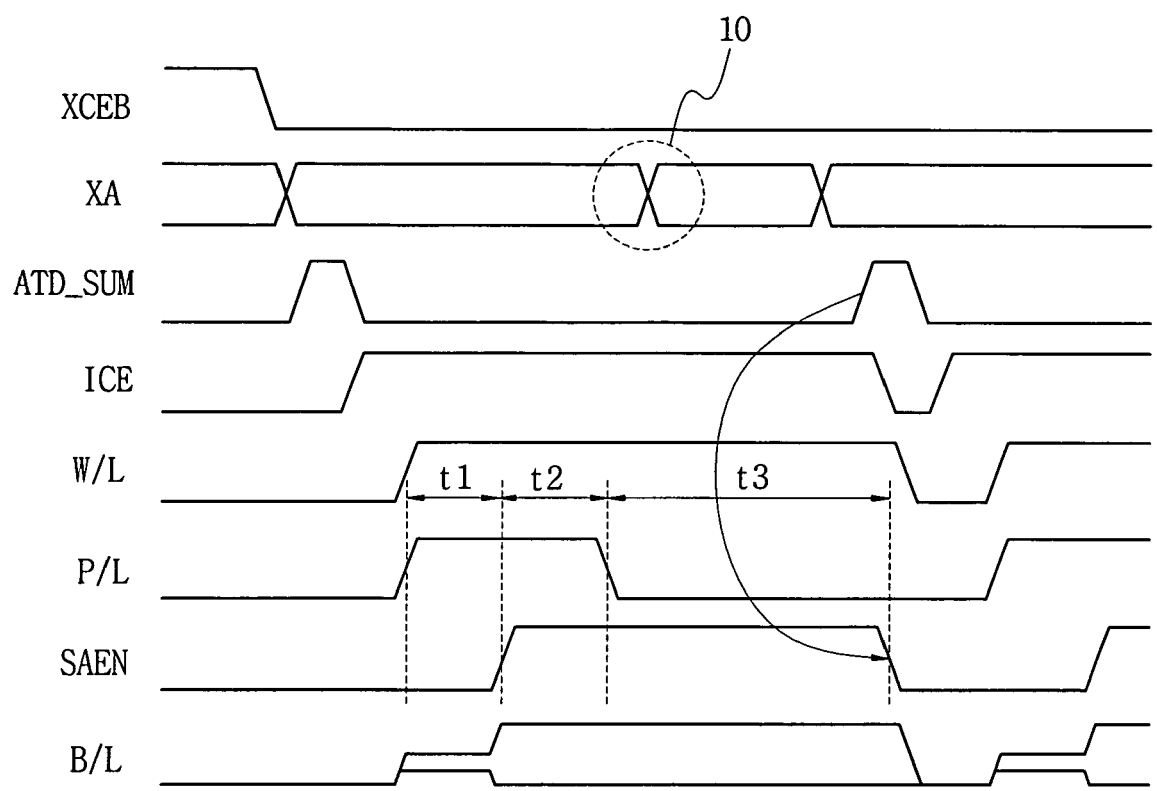
FIG. 7 illustrates timings for read operation of an FRAM shown in FIG. 5.

FIG. 7 illustrates timings for a read operation in a semiconductor memory device to which a drive circuit of FIG. 5 is applied.

As shown in FIG. 7, a read operation in an FRAM starts by a transition from a logic 'high' level of an external chip control signal XCEB to a logic 'low' level, namely, by an enabling the read operation.

An external address signal XA is applied by the enabling of the external chip control signal XCEB. The external address XA is applied to the address buffer circuit 130. The address buffer circuit 130 buffers the applied external address signal XA and generates an internal address signal. The address buffer circuit 130 detects a transition of the internal address signal and generates address transition detection signals ATDi for respective address signals. The address transition detection signals ATDi are added up by the composite pulse signal generating circuit 110, and become a composite pulse signal ATD_SUM as a first address transition detection signal. The composite pulse signal ATD_SUM is a short pulse signal that is enabled for a determined time and then disabled.

An internal chip enable signal ICE is generated by the composite pulse signal ATD_SUM, and the internal control signals needed for operation of the memory device are generated by the internal chip enable signal ICE. The internal chip enable signal is not generated at a transition for enabling the composite pulse signal ATD_SUM, but is generated at a transition for disabling the composite pulse signal ATD_SUM after applying the address transition detection signals ATDi.

When the internal chip enable signal ICE is generated, a word line W/L is enabled by a word line decode and driver circuit (not shown). A plate line P/L is enabled by enabling a plate control signal PPLS generated in response to the internal chip enable signal ICE.

When the plate line P/L is enabled, operation at a charge sharing interval t1 starts. At the charge sharing interval t1, a voltage corresponding to data stored at a memory cell is developed to a bit line B/L that maintains a ground level.

A sense amplifier enable signal SAEN, responding to an enabling of line of the plate control signal, is generated to enable a sense amplifier. When the sense amplifier is enabled, the charge sharing interval t1 is finished, and a sensing interval t2 starts. At the sensing interval t2, data developed to the bit line B/L is sensed and amplified by the sense amplifier.

The sensing interval t2 is finished by a disabling of the plate line P/L through the plate control signal, and a write-back interval t3 starts.

The write-back interval t3 is to restore previous data, the data stored at a memory cell being reversed when the plate line is enabled to perform the read operation. At the write-back interval t3, sufficient time to prevent a breakage of data stored at the write-back interval t3 is provided.

The write-back interval t3 is extended until a point of time when the sense amplifier is disabled by a composite pulse signal ATD_SUM generated subsequently after the plate line P/L is disabled.

A time interval obtained by totaling the charge sharing interval t1 and the sensing interval t2 as a first delay interval, and the write-back interval t3 as a second delay interval. During the first and second delay intervals, a composite pulse signal ATD_SUM is not generated even if an address transition 10 is generated by address noise, etc. Thus, a stabilized read operation can be performed, and a sufficient write-back interval t3 can be provided, thereby preventing or substantially reducing a breakage of data at a memory cell.

When the sense amplifier is disabled, the internal chip enable signal is disabled and the word line W/L is disabled, and read operation is completed. An internal chip enable signal is again generated at a transition for a disabling a next generated composite pulse signal ATD_SUM and its subsequent operation is performed.

As described above, according to an exemplary embodiment of the present invention, a drive circuit of an FRAM stabilizes a read operation and prevents or substantially reduces a breakage of data of memory cells.

Exemplary embodiments of the invention were described above under the assumption of a read operation in the FRAM, but a write operation can be also applied thereto to ensure a write section.

Figure 1:
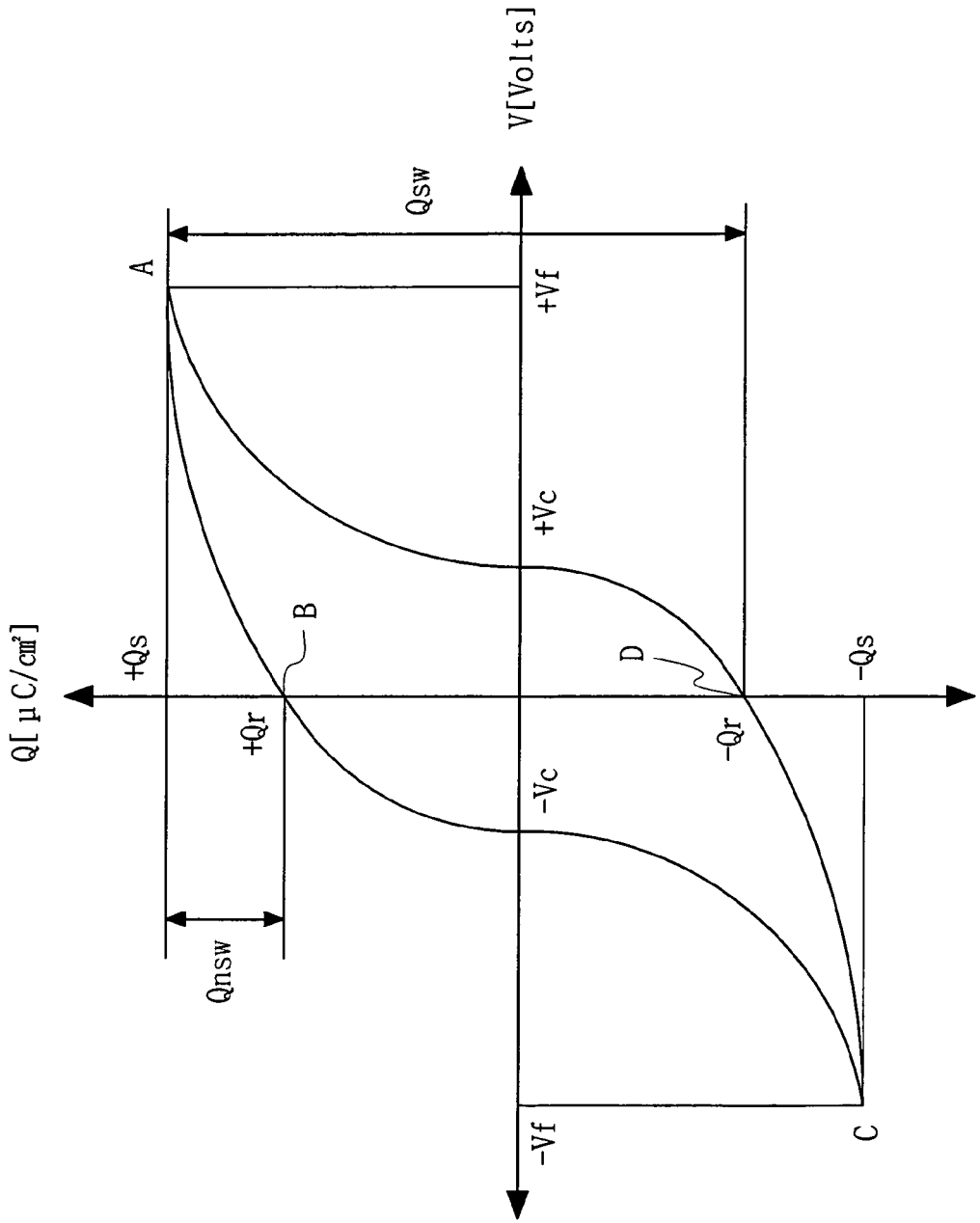
FIG. 1 illustrates a hysteresis curve for ferroelectric material according to a prior art.
Figure 2:
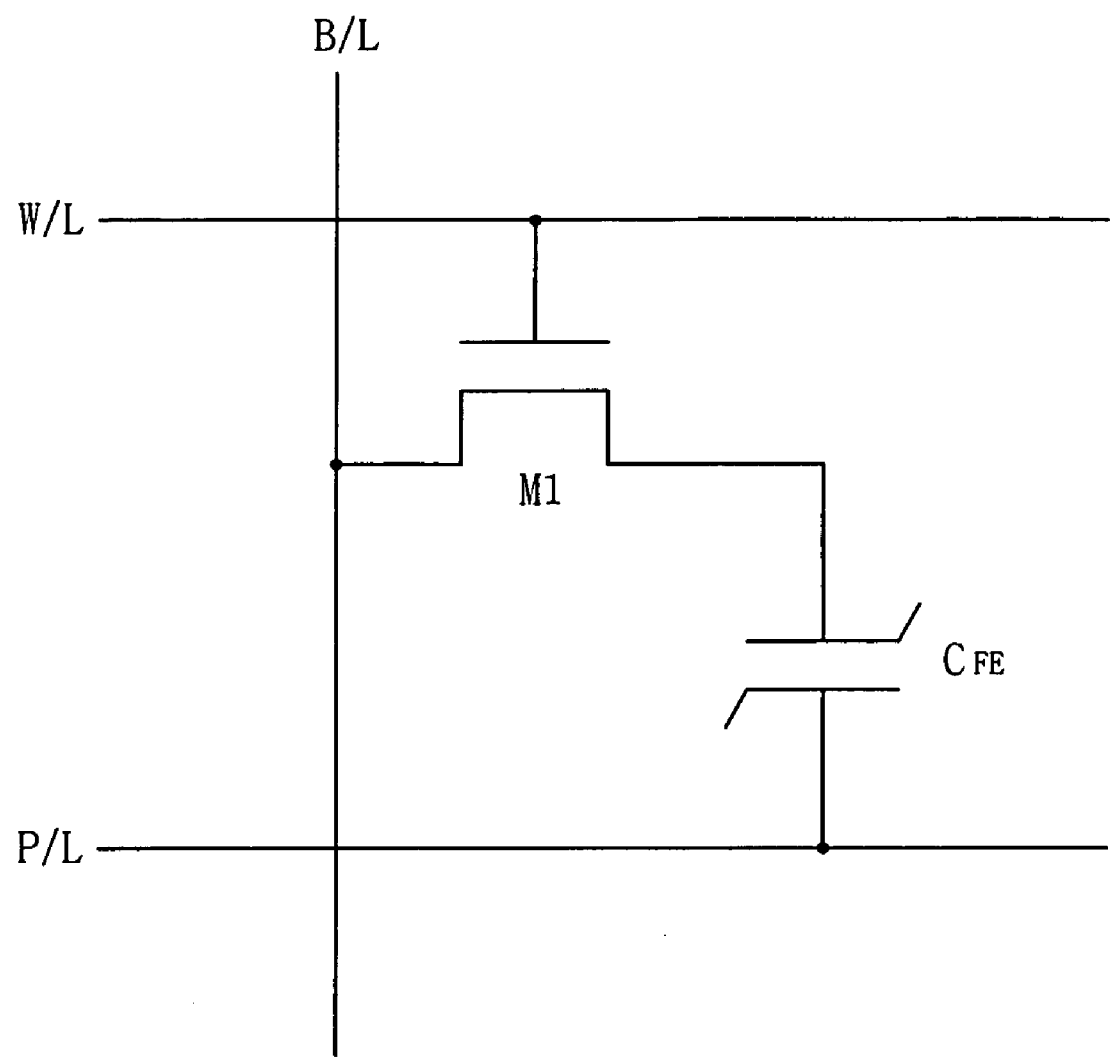
FIG. 2 is a circuit diagram illustrating a memory cell of a ferroelectric memory cell array according to a prior art.
Figure 3:
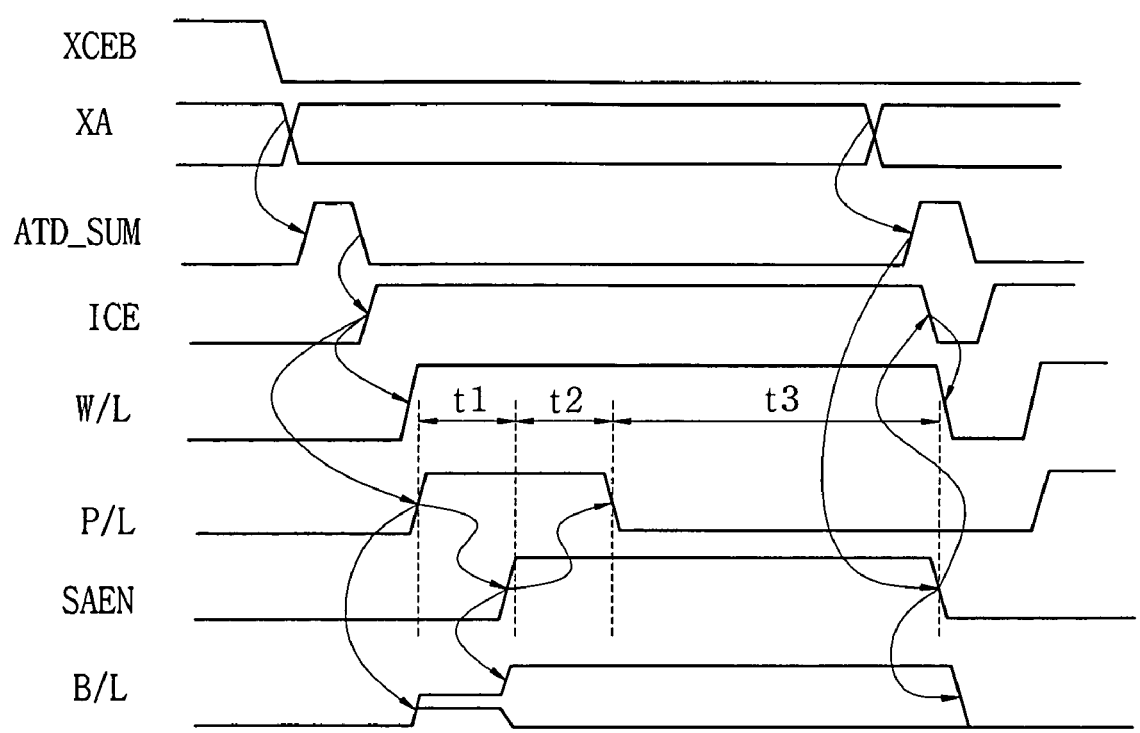
FIG. 3 illustrates timings for read operation in an FRAM according to a prior art.
Figure 4:
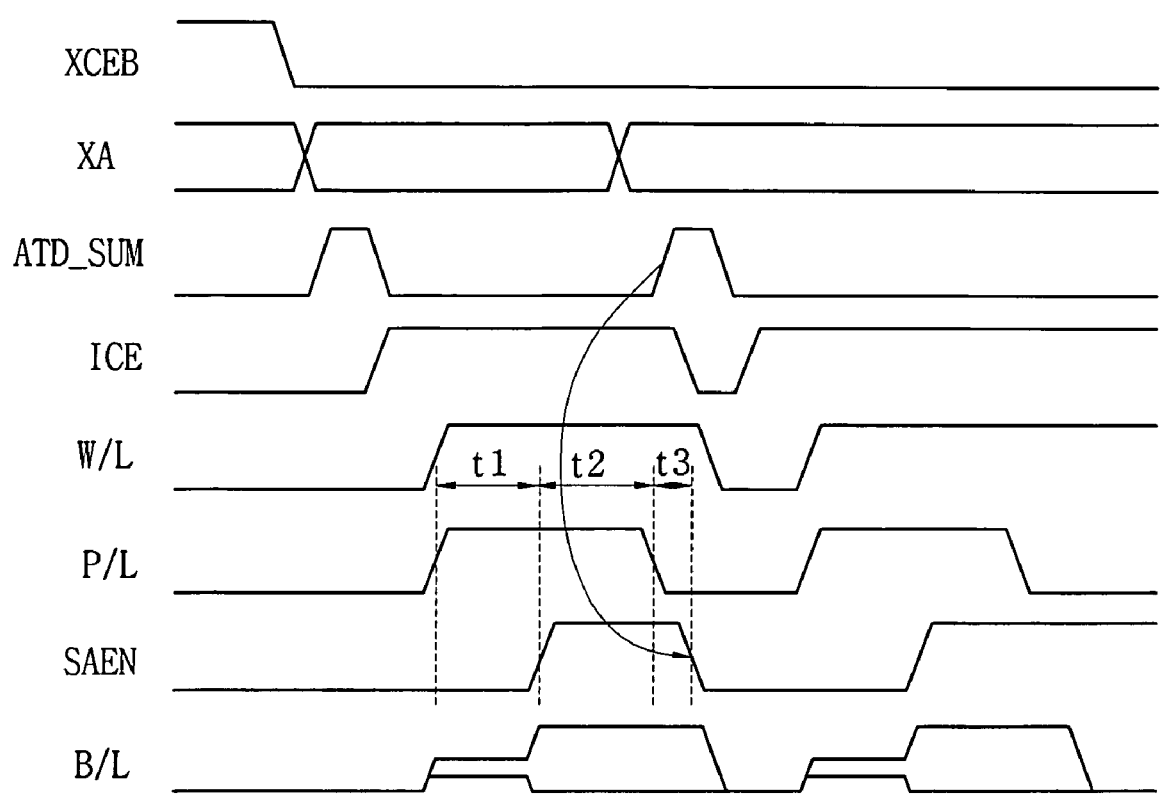
FIG. 4 illustrates timings for an address noise occurrence in an FRAM according to a prior art.

According to an exemplary embodiment of the present invention described above for the case that data '0' corresponded to a state point B of hysteresis loop shown in FIG. 1 and data '1' corresponded to a state point D, and that data of a memory cell was read when a level of bit line had a grounded state and a plate line had a level state of power source voltage. The invention can be applied by those skilled in the art, so that data '1' corresponds to a state point B and data '0' corresponds to a state point D, and read operation can be performed by changing a level state of plate line and bit line through various methods.

As described above, according to an exemplary embodiment of the present invention, stabilized operations can be executed by limiting a generation of composite pulse signal generable by address noise, etc. in operating an FRAM, and a breakage of data stored at memory cells can be prevented or substantially reduced.

While the present invention has been particularly shown and described with reference to exemplary embodiments thereof, it will be understood by those skilled in the art that various changes in form and details may be made therein without departing from the spirit and scope of the present invention. For example, an internal configuration of the circuit may be varied or internal elements of the circuit may be replaced with other equivalent elements. Accordingly, these and other changes and modifications are seen to be within the true spirit and scope of the invention.

What is claimed is:

1. A drive circuit of a FRAM (Ferroelectric Random Access Memory), comprising:
    an address buffer circuit for buffering an applied external address signal and generating an internal address signal, and detecting a transition of the internal address signal and generating a plurality of address transition detection signals for respective internal address signals;
    a composite pulse signal generating circuit for preventing a subsequent generation of a second composite pulse signal in response to a subsequent transition of the internal address signal during a delay interval provided after a generation of a first composite pulse signal, in generating the second composite pulse signal obtained by totaling the plurality of address transition detection signals; and
    an internal chip enable buffer circuit for generating an internal chip enable signal to generate an internal control signal, in response to the composite pulse signal.

2. The circuit of claim 1, wherein the internal chip enable signal is generated in response to a transition for disabling the composite pulse signal.

3. The circuit of claim 1, further comprising a plate control signal generating circuit for generating a plate control signal for enabling and disabling a plate line in response to the internal chip enable signal.

4. The circuit of claim 3, wherein the delay interval is a time interval obtained by totaling a first delay interval as an enable interval of the plate control signal and a second delay interval having a time after disabling the plate control signal.

5. The circuit of claim 4, wherein the first delay interval is a time interval sufficient to sense data of a memory cell in a read operation of the FRAM, and the second delay interval is a time interval sufficient to perform a restoring of previous data.

6. The circuit of claim 5, wherein the composite pulse signal generating circuit comprises:
    a composite pulse signal generating part for totaling and outputting a sum of the plurality of address transition detection signals;
    a delay part for outputting an output signal of the composite pulse signal generating part as the second composite pulse signal, before the plate control signal is enabled when the internal chip enable signal is not applied, and for outputting an output signal to restrict an effect of the output signal of the composite pulse signal generating part outputted as the second composite pulse signal, at a time interval obtained by totaling the first and second delay intervals, after an enabling of the plate control signal; and an output part for generating the composite pulse signals in response to an output signal of the composite pulse signal generating part and an output signal of the delay part.

7. The circuit of claim 6, wherein the composite pulse signal generating part comprises a first NAND circuit for performing a NAND operation on the respectively inputted address transition detection signals.

8. The circuit of claim 7, wherein the delay part comprises:
a first inverter for inverting the plate control signal; a second inverter for inverting an output signal of the first inverter;
a delay unit for delaying for a time an output of the second inverter; a third inverter for inverting an output signal of the delay unit;
a second NAND circuit performing a NAND operation on an output signal of the first inverter and an output signal of the third inverter; and
a fourth inverter for inverting an output of the second NAND circuit and applying it as an input signal of the output part.

9. The circuit of claim 8, wherein the output part comprises:
a third NAND circuit a NAND operation on an output signal of the composite pulse signal generating part and an output signal of the delay part; and
a fifth inverter for inverting and outputting an output signal of the third NAND circuit, and generating the second composite pulse signal.

10. The circuit of claim 9, wherein the delay part further comprises a PMOS transistor that is driven by the output signal of the first inverter and that controls an input signal level of the third inverter as a power source voltage level.

11. A composite pulse signal generating circuit of a drive circuit of a FRAM (Ferroelectric Random Access Memory), the composite pulse signal generating circuit for limiting a subsequent generation of a second composite pulse signal for a delay interval provided after a generation of a first composite pulse signal, comprising:
a composite pulse signal generating part for totaling and outputting a sum of a plurality of address transition detection signals;
a delay part for outputting an output signal of the composite pulse signal generating part as the second composite pulse signal, before a plate control signal is enabled when an internal chip enable signal is not applied, and for outputting an output signal to restrict an effect of the second composite pulse signal in a time interval, after an enabling of the plate control signal; and
an output part for generating the composite pulse signals in response to an output signal of the composite pulse signal generating part and an output signal of a delay part, wherein the output signal is the time interval.

12. The circuit of claim 11, wherein the composite pulse signal generating part comprises a first NAND circuit for performing a NAND operation on the respectively inputted address transition detection signals.

13. The circuit of claim 12, wherein the delay part comprises:
a first inverter for inverting the plate control signal;
a second inverter for inverting an output signal of the first inverter;
a delay unit for delaying for a time an output of the second inverter;
a third inverter for inverting an output signal of the delay unit;
a second NAND circuit performing a NAND operation on an output signal of the first inverter and an output signal of the third inverter; and
a fourth inverter for inverting an output of the second NAND circuit and applying it as an input signal of the output part.

14. The circuit of claim 13, wherein the output part comprises:
a third NAND circuit a NAND operation on an output signal of the composite pulse signal generating part and an output signal of the delay part; and
a fifth inverter for inverting and outputting an output signal of the third NAND circuit, and generating the second composite pulse signal.

15. The circuit of claim 14, wherein the delay part further comprises a PMOS transistor that is driven by the output signal of the first inverter and that controls an input signal level of the third inverter as a power source voltage level.

16. A drive circuit of a FRAM (Ferroelectric Random Access Memory), comprising:
an address buffer circuit for buffering an applied external address signal and generating an internal address signal, and detecting a transition of the internal address signal and generating a plurality of address transition detection signals for respective internal address signals;
a composite pulse signal generating circuit for limiting a subsequent generation of a second composite pulse signal for a delay interval provided after a generation of a first composite pulse signal, in generating the second composite pulse signal obtained by totaling the plurality of address transition detection signals;
an internal chip enable buffer circuit for generating an internal chip enable signal to generate an internal control signal, in response to the composite pulse signal;
a plate control signal generating circuit for generating a plate control signal for enabling and disabling a plate line in response to the internal chip enable signal,
wherein the delay interval is a time interval obtained by totaling a first delay interval as an enable interval of the plate control signal and a second delay interval having a time after disabling the plate control signal,
wherein the first delay interval is a time interval sufficient to sense data of a memory cell in a read operation of the FRAM, and the second delay interval is a time interval sufficient to perform a restoring of previous data, and
wherein the composite pulse signal generating circuit comprises:
a composite pulse signal generating part for totaling and outputting a sum of the plurality of address transition detection signals;
a delay part for outputting an output signal of the composite pulse signal generating part as the second composite pulse signal, before the plate control signal is enabled when the internal chip enable signal is not applied, and for outputting an output signal to restrict an effect of the output signal of the composite pulse signal generating part outputted as the second composite pulse signal, at a time interval obtained by totaling the first and second delay intervals, after an enabling of the plate control signal; and
an output part for generating the composite pulse signals in response to an output signal of the composite pulse signal generating part and an output signal of the delay part.

* * * * *